United States Patent
Lindfors et al.

(10) Patent No.: US 6,313,775 B1
(45) Date of Patent: Nov. 6, 2001

(54) DELTA-SIGMA MODULATOR WITH TWO-STEP QUANTIZATION, AND METHOD FOR USING TWO-STEP QUANTIZATION IN DELTA-SIGMA MODULATION

(75) Inventors: Saska Lindfors, Espoo; Kari Halonen, Helsinki, both of (FI)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/652,749

(22) Filed: Aug. 31, 2000

(51) Int. Cl.$^7$ ....................................................... H03M 3/82
(52) U.S. Cl. ........................ 341/143; 341/144; 341/172; 341/155; 341/118; 341/120
(58) Field of Search .................................... 341/143, 144, 341/155, 172

(56) References Cited

U.S. PATENT DOCUMENTS

| | | | |
|---|---|---|---|
| 5,055,846 | * 10/1991 | Wekkabd | 341/155 |
| 5,103,229 | * 4/1992 | Ribner | 341/143 |
| 5,442,353 | * 8/1995 | Jackson | 341/143 |
| 5,654,711 | 8/1997 | Fujimori | 341/143 |
| 5,818,374 | 10/1998 | Tan | 341/143 |
| 6,232,901 | * 5/2001 | Abbey | 341/143 |

OTHER PUBLICATIONS

"A High–Resolution Multibit ΣΔ ADC With Digital Correction And Relaxed Amplifier Requirements", Sarhang–Nejad et al., IEEE Journal of Solid–State Circuits, vol. 28, No. 6, 1993.

"A High Resolution Multibit Sigma–Delta Modulator With Individual Level Averaging", Chen et al., IEEE Journal of Solid State Circuits, vol. 30, No. 4, 1995.

"A Low Oversampling Ratio 14–b 500–kHz ΣΔ ADC With A Self–Calibrated Multibit DAC", Baird et al., IEEE Journal of Solid–State Circuits, vol. 31, No. 3, 1996.

"A 19–Bit Low–Power Multibit Sigma–Delta ADC Based On Data Weighted Averaging", Nys et al., IEEE Journal of Solid–State Circuits, vol. 32, No. 7, 1997.

"Oversampling Methods for A/D and D/A Conversion", Oversampling Delta–Sigma Data Converters, Candy et al., IEEE Press, pp. 1–28, 1992.

* cited by examiner

Primary Examiner—Michael Tokar
Assistant Examiner—Lam T. Mai
(74) Attorney, Agent, or Firm—Perman & Green, LLP (57) ABSTRACT

A delta-sigma modulator for converting an analog input signal into a digital output signal comprises a modulator input (501) and a first analog to digital converter (504) coupled to the modulator input (501). The first analog to digital converter has a first analog input and a first digital output. The delta-sigma modulator further comprises an error quantization unit (505, 506, 507) coupled to the first digital output for determining the quantization error caused by the first analog to digital converter (504). Additionally it comprises first signal combining means (508, 708, 802) for combining the outputs of the first analog to digital converter and said error quantization unit to form the digital output signal.

15 Claims, 6 Drawing Sheets

DELTA-SIGMA MODULATOR WITH TWO-STEP QUANTIZATION, AND METHOD FOR USING TWO-STEP QUANTIZATION IN DELTA-SIGMA MODULATION

TECHNOLOGICAL FIELD

The invention concerns generally the field of performing analog to digital conversion through delta-sigma modulation. Especially the invention concerns the division of the internal AD-converter in a delta-sigma modulator into stages in order to simplify its circuit implementation.

BACKGROUND OF THE INVENTION

Delta-sigma modulation or ΔΣ-modulation, known also as sigma-delta or ΣΔ-modulation, means the known principle of reconverting a previous integration and quantization result into analog domain and subtracting it from the next sample to be quantized before feeding said next sample into the actual integration and quantization unit. Analog to digital converters or ADCs based on the ΔΣ-principle are known to be well suited for applications where the maximum baseband frequency is relatively low (e.g. 20 kHz in digital audio applications) but the required resolution is high (e.g. 16–18 bits). They are also suitable for other kind of applications.

Conventional ΔΣ-modulators relied on heavy oversampling and one-bit quantization to ensure linearity and simple circuit implementation, as is described for example in J. C. Candy, G. C. Temes: "Oversampling Methods for A/D and D/A Conversion", Oversampling Delta-Sigma Data Converters, IEEE Press, New York 1992. However, heavy oversampling is synonymous with high clock frequency, which may set a limit to the usability of one-bit quantization solutions when the signal frequency to be sampled should increase. At the priority date of this patent application there is a growing interest towards multi-bit quantization in ΔΣ-modulators, described e.g. in M. Sarhang-Nejad, G. C. Temes: "A High-Resolution Multibit ΣΔ ADC with Digital Correction and Relaxed Amplifier Requirements", IEEE Journal of Solid-State Circuits, Vol. 28, No. 6, June 1993; or F. Chen, B. H. Leung: "A High Resolution Multibit Sigma-Delta Modulator with Individual Level Averaging", IEEE Journal of Solid-State Circuits, Vol. 30, No.4, April 1995; or R. T. Baird, T. S. Fiez: "A Low Oversampling Ratio 14b 500-kHz ΔΣ ADC with a Self-Calibrated Multibit DAC", IEEE Journal of Solid-State Circuits, Vol. 31. No. 3, March 1996; or O. Nys, R. K. Henderson: "A 19-Bit Low-Power Multibit Sigma-Delta ADC Based on Data Weighted Averaging, IEEE Journal of Solid-State Circuits, Vol. 32. No. 7, July 1997.

Figure 1:
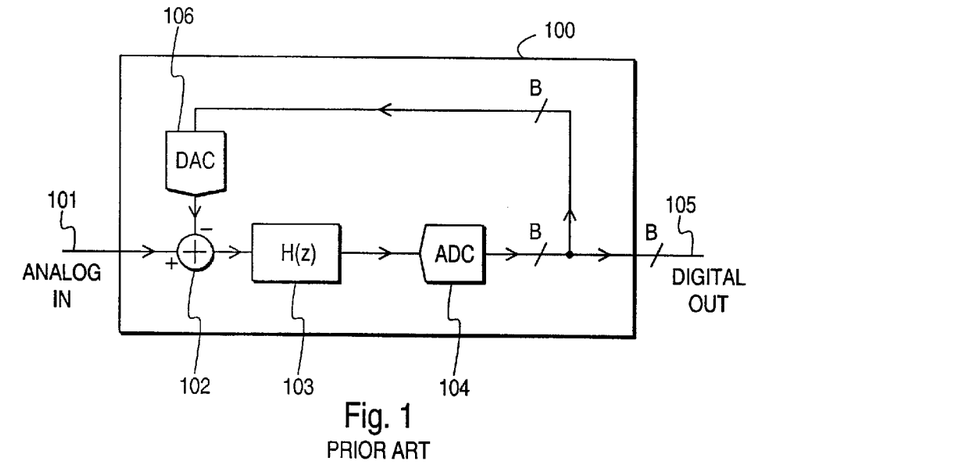
FIG. 1 illustrates a known multibit ΔΣ-modulator.

FIG. 1 illustrates the basic principle of multibit ΔΣ-modulation. An analog signal is fed into the modulator 100 through line 101 which leads into the the positive input terminal of an adder unit 102. The output of the adder unit is coupled to a loop filter 103 which implements an integration; the transfer function of the loop filter is usually designated as H(z) because transfer functions are most easily handled through their z-transforms. The output of the loop filter is still an analog signal and it is coupled to an analog to digital converter 104 which converts it into a digital word of B bits. This digital word constitutes the output of the modulator 100 at the output line 105. The digital word is also coupled to the input of a digital to analog reconverter 106 which reconverts it into an analog signal to be coupled to the negative input terminal of the adder unit 102.

Figure 2:
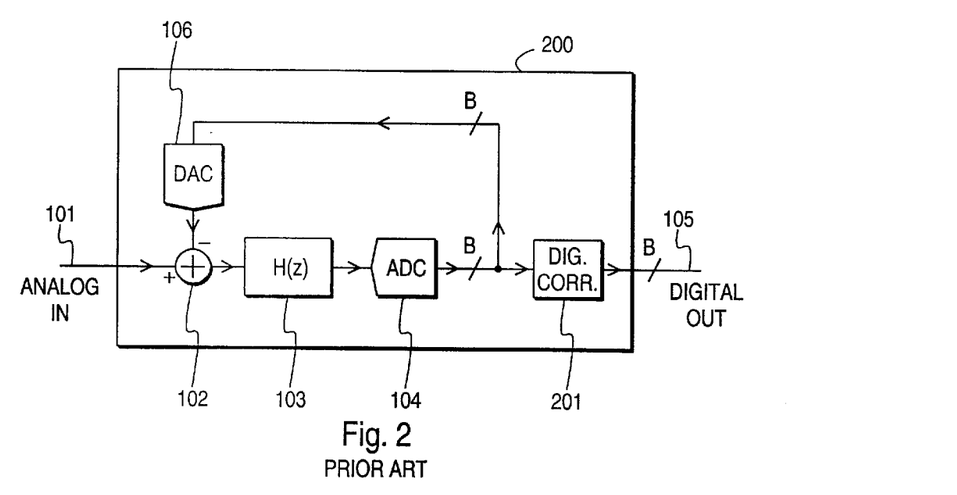
FIG. 2 illustrates a known digitally corrected ΔΣ-modulator.

The nonlinearity effects of multibit ΔΣ-modulators are largely caused by the nonlinearity of the internal DAC or digital to analog converter which reconverts a previously quantized sample into the analog domain before it gets subtracted from the following sample to be quantized. Several approaches have been proposed to compensate for said nonlinearity effects. FIG. 2 illustrates the known basic principle of digitally correcting the output of a sigma-delta modulator 200 by introducing a correction unit 201 between the output of the ADC 104 and the output line 105. The correction unit 201 may use for example a RAM (random access memory) to convert the nonlinearly distorted output readings of the ADC 104 into correct output words. Another approach to solving the nonlinearity problem is known as dynamic element matching or DEM, meaning that the elements that are used for the digital to analog conversion are alternated.

Figure 3:
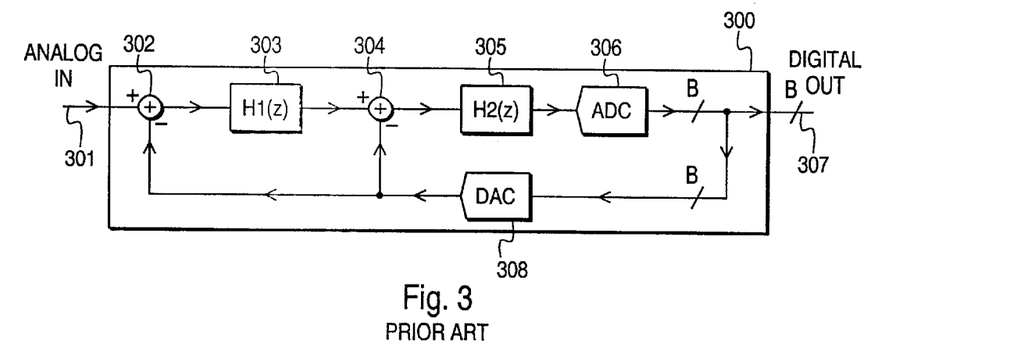
FIG. 3 illustrates a known second-order multibit ΔΣ-modulator.

It is also known to chain multiple adder-integrator pairs to obtain a ΔΣ-modulator of a higher order. Such higher order ΔΣ-modulators give a better signal to noise ratio for a given oversampling rate. FIG. 3 illustrates a known second-order ΔΣ-modulator 300 where from the input line 301 there is a series connection of a first adder unit 302, a first loop filter 303, a second adder unit 304, a second loop filter 305 and a multibit ADC converter 306 to the output line 307. The input line 301 is coupled to the positive terminal of the first adder 302, and the output of the first loop filter 303 is coupled to the positive terminal of the second adder 304. From the output of the multibit ADC converter 306 there is also a coupling to a multibit DAC 308, the output of which is coupled to the negative terminals of both adder units 302 and 304.

Figure 4:
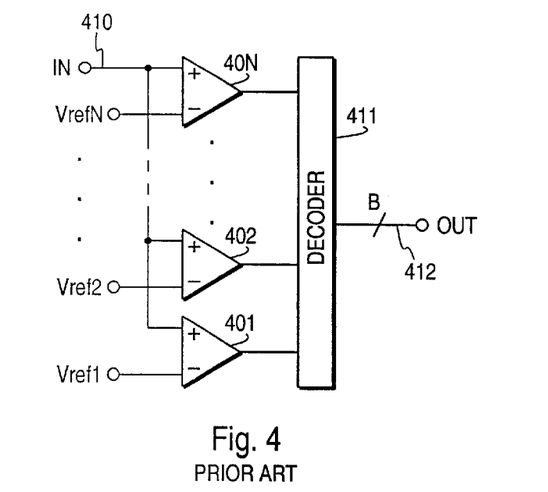
FIG. 4 illustrates a known Flash ADC architecture.

A feature common to all known multibit ΔΣ-modulators is that the analog to digital conversion has to be performed during a single clock cycle. The conversion result must be available to the feedback DAC well before the next integration phase in order to keep the feedback loop from going unstable. FIG. 4 illustrates a known Flash-type ADC which is the only architecture known at the priority date of this patent application for implementing the analog to digital conversion in a single clock cycle. The input line 410 is coupled to the positive input of N parallel differential amplifiers 401, 402, . . . 40N coupled as comparators. A different reference voltage level Vref1, Vref2 . . . VrefN is coupled to the negative input of each comparator so that the output level of a comparator is either low or high depending on whether the instantaneous voltage level in the input line 410 is lower or higher than the reference voltage level coupled to that particular comparator. The outputs of the comparators constitute a so-called thermometer signal in which ideally all comparator outputs below a certain level (i.e. comparators 401 to 40P, where P≦N) are high and the rest of the comparator outputs are low. The comparator outputs are coupled to a decoder 411 which converts the thermometer signal into a digital word of B bits written into an output line 412. Various solutions are known to compensate for the so-called bubble errors or discontinuities in the row of comparator outputs that have the same value.

It is easily seen that in order to implement analog to digital conversion with the resolution of B bits, $2^B-1$ comparators are needed, i.e. $N=2^B-1$ in FIG. 4. If the number N gets very large (say, N=255 for B=8), the array of comparators will reserve a considerable fraction of the available limited circuit area in an integrated circuit that houses the ΔΣ-modulator. Although it is true that the linearity requirements for the internal Flash-type ADC in a ΔΣ-modulator is rather relaxed in comparison to standalone analog to digital converters (any nonlinearity is divided by the gain of the preceding integrator(s)), and consequently the comparators can be made relatively small, the prohibitively large reservation of circuit area may become a limiting factor in modern electronic devices where miniaturization is a key design factor. Additionally a very large number of parallel comparators may have a very adverse effect on the power consumption of the ΔΣ-modulator, since the integrator that preceeds the Flash-type ADC must be able to drive the relatively high input capacitance of such a large comparator array at a very high clock rate, which is an energy-consuming task.

SUMMARY OF THE INVENTION

It is an object of the present invention to provide a ΔΣ-modulator which would avoid the drawbacks of a high oversampling frequency and a large number of parallel comparators in the internal analog to digital converter. It is an additional object of the invention to provide a method for converting an analog signal into digital form with ΔΣ-modulation associated with low energy consumption and low complexity requirements for hardware implementation.

The objects of the invention are achieved by dividing the analog to digital conversion into stages and performing different stages on different clock cycles.

The invention concerns a ΔΣ-modulator which comprises a first analog to digital converter having a first analog input and a first digital output.

It is characterized in that it comprises an error quantization unit coupled to the first digital output for determining the quantization error caused by the first analog to digital converter first signal combining means for combining the outputs of the first analog to digital converter and said error quantization unit to form the digital output signal.

Additionally the invention concerns a method which comprises the steps of a) subtracting from an analog sample the equivalent of a previously digitized sample b) filtering the result of step a)

c) converting the result of step b) into digital form d) feeding the result of step c) into a feedback loop to be used as the equivalent of a previously digitized sample in the conversion of a subsequent analog sample.

It is characterized in that it additionally comprises the steps of e) quantizing the quantization error caused in step c)

f) combining the results of steps c) and e) into a digital output signal.

According to the invention there are at least two analog to digital converters in the ΔΣ-modulator. A feedback word which is also an output word is composed in at least two stages so that in the first stage a first subset of the bits in the feedback word are produced by a first analog to digital converter and in the second stage a second subset of the bits in the feedback word are produced by a second analog to digital converter. Between said first and second stages the first subset of bits is reconverted into analog domain and a subtraction is performed between it and the input of the first analog to digital converter; the result of the subtraction is fed into the second analog to digital converter.

If there are exactly two stages in the ΔΣ-modulation according to the invention, most advantageously the first subset of bits consists of the M most significant bits in the feedback word and the second subset of bits consists of the N least significant bits in the feedback word so that B or the total width of the feedback word in bits is the sum of M and N. If there are more than two ADC stages in the ΔΣ-modulation according to the invention, most advantageously the first subset of bits consists of the M most significant bits in the feedback word, the second subset of bits consists of the N1 next most significant bits, the third subset of bits consists of the N2 next most significant bits and so on until the (N+1)th subset of bits consists of the NN least significant bits and M+N1+N2+ . . . +NN=B.

For each separate analog to digital conversion it is true that the required number of comparators is $2^X-1$, where X=M, N1, N2, . . . , NN. However, if for example in a two-stage ΔΣ-modulator according to the invention B=8 and M=N=4, only 15+15=30 comparators are needed which is remarkably less than the 255 comparators needed to produce a B-bit wide feedback word in the single-stage arrangements of prior art.

BRIEF DESCRIPTION OF DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

In the description of prior art above we have referred to FIGS. 1 to 4, so the following description of the invention will concentrate on FIGS. 5 to 12. Similar parts in the drawings are designated with same reference designators.

DETAILED DESCRIPTION OF THE INVENTION

Figure 5:
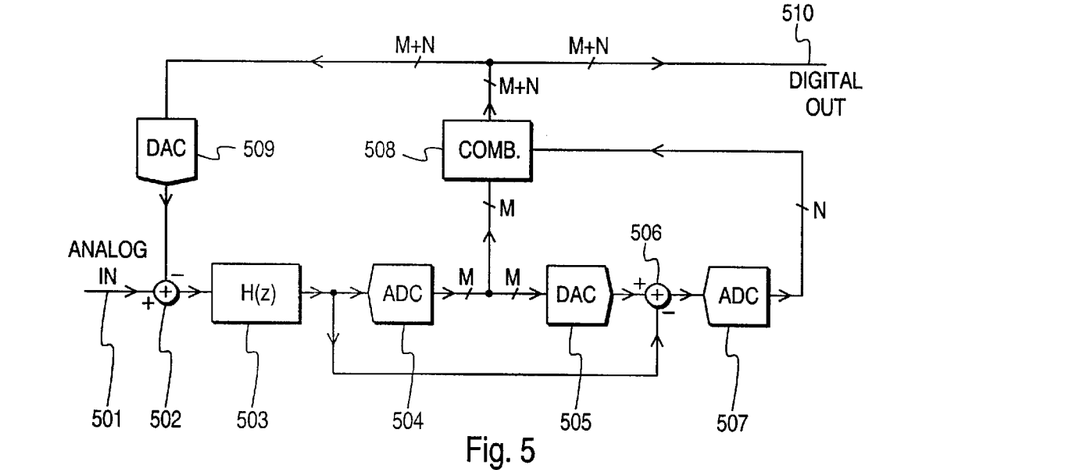
FIG. 5 illustrates a two-stage multibit ΔΣ-modulator according to the invention.

FIG. 5 illustrates a multibit ΔΣ-modulator according to a first embodiment of the invention. An input line 501 is coupled to the positive terminal of a first adder unit 502. The output of the first adder unit 502 is coupled to a loop filter 503 which implements an integration with a transfer function the z-transform of which is designated here by H(z). The output of the loop filter 503 is coupled to a first AD converter 504 which we could also designate as the coarse quantization converter. The output of the first AD converter 504 is an M-bit wide digital bus which is coupled to the input of a first DA reconverter 505, the analog output of which is further coupled to the positive terminal of a second adder unit 506. Here M is a positive integer. The output of the loop filter 503 is coupled to the negative terminal of the second adder unit 506. The output of the second adder unit 506 is coupled to a second AD converter 507 which we could also designate as the fine quantization converter. The output of the second AD converter 507 is an N-bit wide digital bus which is coupled to a combiner 508. Here N is a positive integer. Also the output of the first AD converter 504 is coupled to the combiner 508 so that the output of the combiner 508 is an M+N-bit wide digital bus in which ideally the M bits read from the first AD converter 504 are the most significant bits and the N bits read from the second AD converter 507 are the least significant bits. In practical implementations the combiner 508 is most probably an adder unit which calculates the sum of its inputs (taking into account their relative order of magnitude), because it is possible that the value represented by the N least significant bits "leaks over" into the more significant bits. The output of the combiner 508 is coupled to the input of a second DA reconverter 509, the output of which is coupled to the negative terminal of the first adder unit 502. The output of the combiner 508 is also coupled to the output line 510.

The ΔΣ-modulator illustrated in FIG. 5 operates as follows. The input section consisting of the input line 501, the first adder unit 502 and the loop filter 503 has a similar function as in known ΔΣ-modulators: an analog signal on line 501 is subjected to certain subtraction in the adder 502 and to certain (integration) filtering in the loop filter 503. Even the transfer function H(z) of the loop filter 503 may be of a known kind, although the invention should not be construed to limit the selection of a transfer function. However, in accordance with the invention the output signal of the loop filter 503 is not completely quantized at once, but in at least two steps. At the first quantization step the first AD converter 504 maps the analog output signal of the loop filter 503 into a relatively coarse grid of quantization steps, which would be represented by the M most significant bits of a complete M+N-bit conversion. The resulting digital word of M bits is fed into the first DA reconverter 505 which reproduces an analog voltage. The value of the analog voltage is (ideally) exactly that represented by the input word, so the quantization error or maximum difference between the input of the first AD converter 504 and the output of the first DA reconverter 505 is one half of the quantization step of the first AD converter 504 into either direction.

Said difference is calculated by subtracting, in the second adder unit 506, from the output of the first DA reconverter 505 the same signal which formed the input of the first AD converter 504. The resulting difference is quantized in the second AD converter 507. Conceptually we may imagine that the second AD converter 507 has a finer quantization step than that used in the first AD converter 504. The relative fineness of the quantization steps then depends on the number of bits N allocated to the second AD converter 507: the size of the finer quantization step is $(\frac{1}{2})^N$ of the size of the coarser quantization step. In practice the output of the second adder unit 506 is amplified and the same absolute value is used for the quantization step in both the first 504 and the second 507 AD converter. Compact circuit solutions known as MDACs or multiplying digital to analog converters are available that implement the functions of blocks 505 and 506 as well as the required amplification.

In the combiner 508 the outputs of the AD converters 504 and 507 are combined so that if timing considerations and the nonideal characteristics of the components are neglected, the output of the combiner 508 is the same as the output of a direct M+N-bit wide AD conversion would be.

However, previously we have explained that the simple combination of most significant and least significant bits is most preferably replaced by summing; additionally in a fast ΔΣ-modulator timing considerations can not be neglected. The coarse AD conversion in the first AD converter 504 takes place during one cycle of the clock frequency that controls the operation of the ΔΣ-modulator. The coarsely quantized result is immediately available for combining in the combiner 508, and the output of the combiner is likewise immediately available for DA reconversion in the second DA reconverter 509. The DA reconversion of the coarsely quantized result in the first DA reconverter 505 takes place simultaneously with said DA reconversion in the second DA reconverter 509, and the subtraction operation in the second adder unit 506 takes place simultaneously with the subtraction of the output of the second DA reconverter 509 from the next input signal sample in the first adder unit 502. Consequently the fine AD conversion in the second AD converter 507 does not take place before the next clock cycle, which also corresponds to a subsequent coarse AD convertion in the first AD converter 504. As this deduction shows, the combiner 508 actually combines (sums) the M bits coming from the coarse quantization of one signal sample with the N bits coming from the fine quantization of the immediately previous signal sample.

In case the output value of the combiner 508 is outside the input range of the second DA reconverter 509 used for feedback, clipping can be used to limit its value so that it fits into said input range. Such clipping is not a potential source of errors, since the nature of the feedback tends to correct any errors caused.

The savings obtained in component complexity and energy consumption are obvious when the ΔΣ-modulator of FIG. 5 is compared to a conventional ΔΣ-modulator shown e.g. in FIG. 1. If we assume that B=8 in FIG. 1 and M=N=4 in FIG. 4 the ΔΣ-modulators are comparable: both are basically multibit ΔΣ-modulators with 8 bits resolution in the AD conversion. However, as we stated previously the number of comparators in each flash-type AD converter is equal to $2^B-1$ (or $2^M-1$ or $2^N-1$, using the characters M and N appearing in FIG. 5). The conventional ΔΣ-modulator of FIG. 1 required 255 comparators and a loop filter which is capable of driving a correspondingly high input capacitance at a very high speed, while the ΔΣ-modulator of the invention according to FIG. 5 only requires 15+15 comparators and fractional driving capability.

Figure 6:
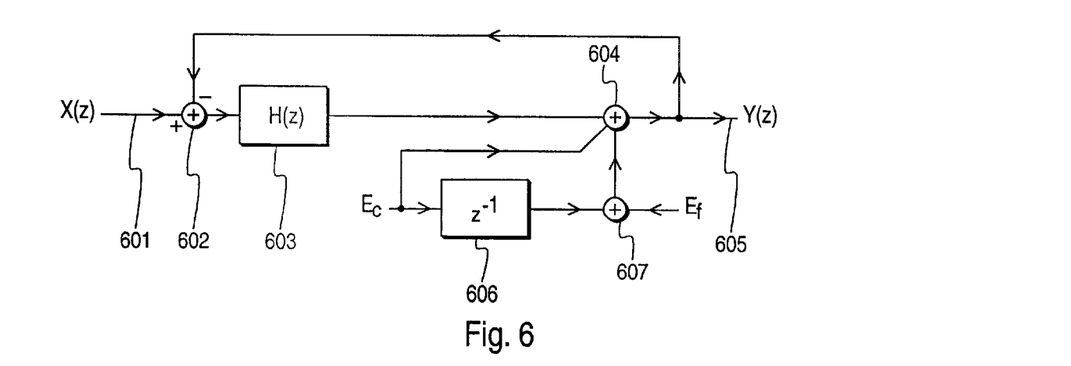
FIG. 6 illustrates a signal flow graph associated with the embodiment of FIG. 5.

The fact that the combined M+N-bit wide output (and feedback) word actually comes from two different samples of the output signal does cause some additional quantization noise, but simulation has shown that as long as the oversampling ratio remains high enough, the quantization noise does not cause essential performance degradation. FIG. 6 illustrates a signal flow graph of the ΔΣ-modulator architecture illustrated in FIG. 5. An input signal X(z) is present at the input line 601 which is coupled to a positive input terminal of a first adder 602. The output of the first adder is coupled through a loop filter 603 (the transfer function of which is H(z)) to a second adder 604. The output of the second adder 604 is the output line 605 where an output signal Y(z) can be obtained. The output of the second adder 604 is also coupled as a feedback to a negative input terminal of the first adder 602. A coarse quantization noise source $E_c$ is coupled to another positive input terminal of the second adder 604 as well as through a $z^{-1}$ transfer function block 606 to a negative terminal of a third adder 607. A fine quantization noise source $E_f$ is coupled to a positive input terminal of the third adder 607, and the output of the third adder 607 is coupled to another positive input terminal of the second adder 604.

The output signal Y(z) is a function of the input signal X(z) as follows:

$$Y(z) = \frac{H(z)}{1+H(z)}X(z) + \frac{(1-z^{-1})E_c(z) + E_f(z)}{1+H(z)}$$

In the latter term there appear two different noise transfer functions of which the one associated with the coarse quantization error is one degree higher. This may be interpreted so that when we go towards larger oversampling ratios, the significance of the coarse quantization error dies off more quickly. If we assume that M=N, the power of the coarse quantization error is given by $$e_c^2 = \left(\frac{2^{2M}-1}{2^M-1}\right)^2 e_f^2$$

It can be mathematically shown that the fine quantization error dominates approximately if the oversampling ratio OSR is higher than a certain limit, namely $$OSR > \frac{\sqrt{1-2^{-2M}}}{2^{-M}}\pi$$

which gives a crossover oversampling ratio of 50.2 when M=4.

Keeping M and N equal is usually the optimal solution from the viewpoint of minimized implementation complexity. If the sum M+N is kept constant and bits are transferred from N to M, the complexity of the coarse AD converter and the energy consumption of the driving section in the loop filter are increased but the crossover OSR is reduced: transferring one bit from N to M halves the crossover OSR. Adding bits to M while keeping N constant would increase the overall resolution and keep the crossover OSR unaltered.

Stability is a key concern in ΔΣ-modulators. The architecture of FIG. 5 is stabilized by the fact that most of the signal power transfers the feedback loop without any additional latency. Only a small corrective term experiences an additional delay of one clock cycle. Simulation has shown that in a two-stage quantization ΔΣ-modulator the loop filter must be designed so that it allows for some extra variation in the quantizer gain due to the additional quantization error. A worst case assumption is that the additional quantization error will double the variation in the quantizer gain. It is obvious as such to a person skilled in the art how to design a loop filter so that it allows for such additional variation.

Matching the two different AD conversions 504 and 507 so that no systematical error occurs will enhance the performance of the ΔΣ-modulator of FIG. 5, although simulation has shown that a gain error smaller than 4.4% is tolerable in practical cases. The significance of mismatch is directly proportional to the oversampling ratio.

Figure 7:
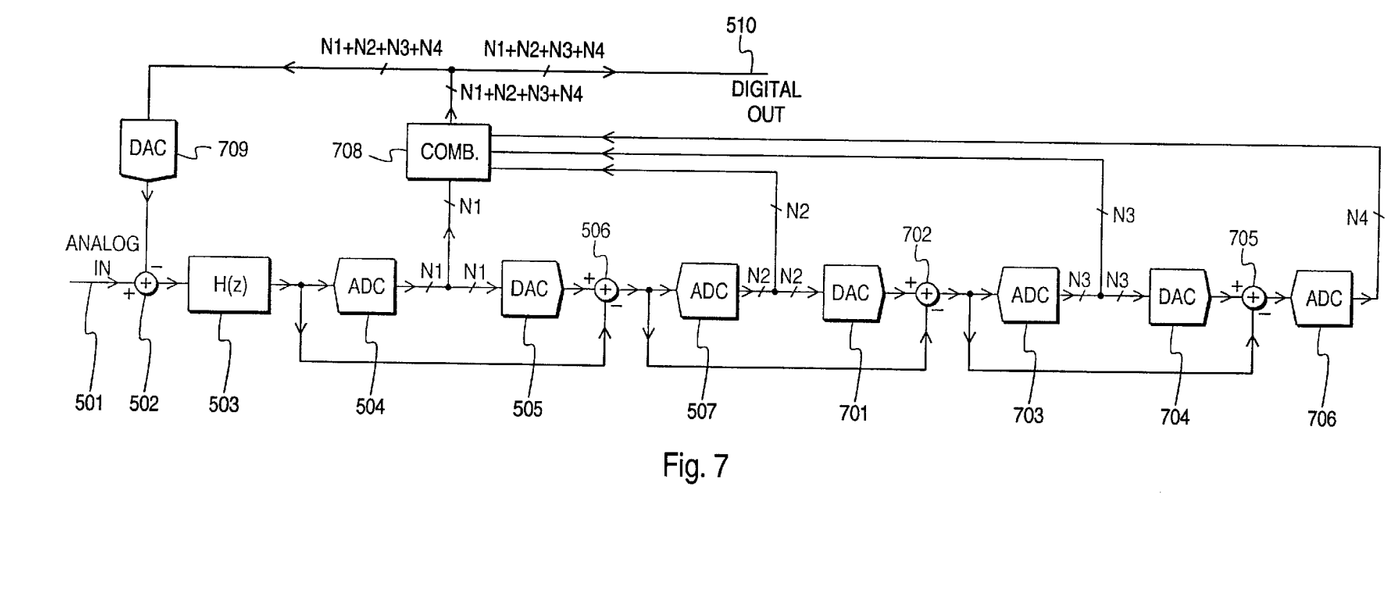
FIG. 7 illustrates a modification to the embodiment of FIG. 5.

FIG. 7 shows an extended multibit multistage ΔΣ-modulator which is a possible variation of the first embodiment of the invention. The analog input line 501, the first adder 502, the loop filter 503, the first AD converter 504, the first DA reconverter 505, the second adder 506 and the second AD converter 507 are the same as in the embodiment of FIG. 5 and have similar functions with the exception that the number of output bits from the first AD converter 504 is now N1 instead of M, the number of output bits from the second AD converter 507 is now N2 instead of N, and that there are connections from between the second adder 506 and the second AD converter 507 and from the output of the second AD converter 507 to the further parts of the circuit. Namely, the N2-bit wide output of the second AD converter 507 is again reconverted into analog domain with a third DA reconverter 701. A third adder 702 is used to subtract from the output of the third DA reconverter 701 the input to the second AD converter 507, so that the output of the third adder 702 represents the quantization error caused in the second AD converter 507 and is smaller than or equal to one half of the quantization step used in the second AD converter 507. This result is again AD converted in a third AD converter 703 with a quantization step that is smaller than or equal to one half of the quantization step used in the second AD converter 507, resulting in another digital output word of N3 bits. An even further DA reconversion, subtraction and AD conversion round is performed in the fourth DA reconverter 704, fourth adder 705 and fourth AD converter 706. The quantization step used in the fourth AD converter 706 is smaller than or equal to one half of the quantization step used in the third AD converter 703, and the quantization result is a word of N4 bits.

Previously we have explained how the smaller size of the quantization steps in the later AD conversions is only conceptually true, since the amplification of the calculated quantization error in each previous stage enables us to use exactly the same absolute value for the quantization step in each AD converter.

The combiner 708 is arranged to combine its inputs into a digital output word of N1+N2+N3+N4 bits which is led both to the digital output line 510 and the second DA reconverter 709, which gives its output as feedback to the negative input terminal of the first adder 502. The timing of the AD conversions and DA reconversions is such that if the N1-bit wide output of the first AD converter 504 is associated with a certain first sample, the N2-bit wide output of the second AD converter 507 is associated with the sample immediately preceding said first sample, the N3-bit wide output of the third AD converter 703 is associated with the sample that came two clock cycles before said first sample and the N4-bit wide output of the fourth AD converter 706 is associated with the sample that came three clock cycles before said first sample. The selection of the numbers of bits N1, N2, N3 and N4 is left to the implementation designer. It is clear that the general idea of multibit multistage ΔΣ-modulation can be also realized with two DA reconversion—AD conversion rounds instead of three, or with more DA reconversion—AD conversion rounds than three.

Figure 8:
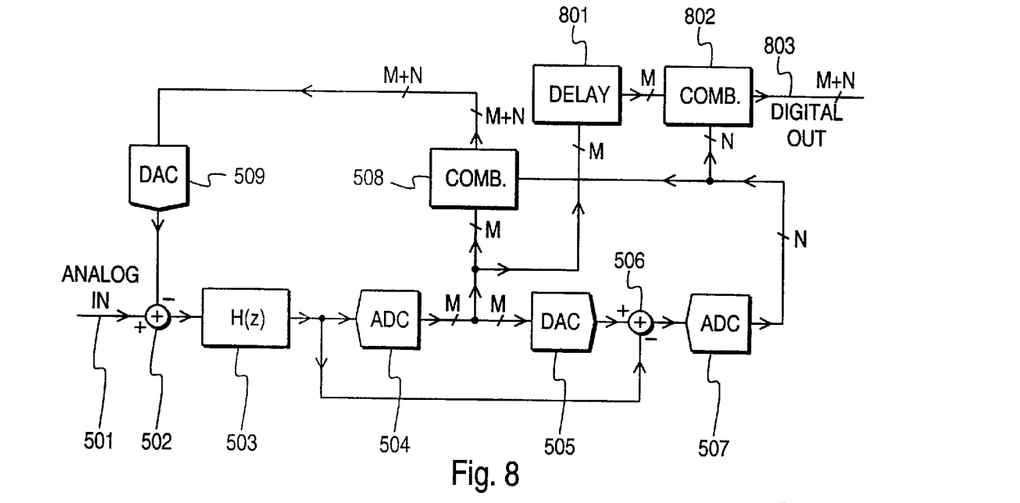
FIG. 8 illustrates another modification to the embodiment of FIG. 5.

FIG. 8 illustrates a proposed modification to the embodiment of FIG. 5. The idea behind this modification is that the rapidity of providing an AD conversion result in a ΔΣ-modulator is only dictated by the need of providing a major part of the feedback power to the feedback loop already before the next clock cycle. It is seldom necessary to provide the actual output of the ΔΣ-modulator so fast that the delay of one additional clock cycle would be of importance. Therefore the output of the ΔΣ-modulator in FIG. 8 is constructed by delaying the M most significant bits by the duration of one clock cycle in a delay element 801 before combining them with the N least significant bits in a second combiner 802 and outputting the M+N-bit wide output word on line 803. In the digital output word on line 803 the most significant bits and the least significant bits have their origin in one and the same sample. The rest of the circuit elements in FIG. 8 function exactly as in the embodiment of FIG. 5. However, the correct operation of ΔΣ-modulators requires that the signal which is fed into the feedback loop is exactly the same which is given as the output of the modulator, so the theoretical embodiment of FIG. 8 has little practical significance.

Figure 9:
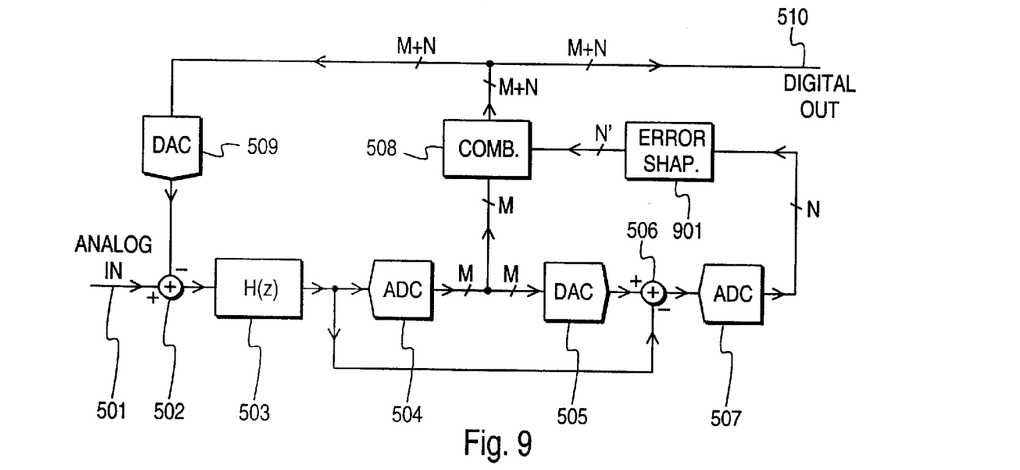
FIG. 9 illustrates another modification to the embodiment of FIG. 5.

FIG. 9 illustrates an extension to the embodiment of FIG. 5. Again most parts in the circuit are exactly similar to their counterparts in FIG. 5, which is emphasized through the use of same reference designators. The only difference to the embodiment of FIG. 5 is the use of an error shaping block 901 between the output of the second AD converter 507 and the combiner 508. Said error shaping block houses a register for storing K consecutive N-bit wide output values from the second AD converter 507 and weighted summing means for obtaining a weighted sum of the contents of the stored values. These detailed contents of block 901 are not shown in FIG. 9. The principle of error shaping means that a predictive algorithm known as such is used to predict an unknown value from a number of immediately preceding values. In other words, the delay of one clock cycle caused by the DA reconversion, subtraction and AD conversion in blocks 505, 506 and 507 is compensated through prediction so that the output of the combiner 508 would more closely represent the ideal direct M+N-bit wide AD conversion result of a single sample. The error shaping feature may require a different number of bits than N to be fed into the combiner 508, which is emphasized in FIG. 9 by designating the width of the corresponding connection with N'.

An advantageous value for the number K mentioned above has been found to be three. A value two for K would work well if only transfer functions were discussed, but simulation has shown that using only two consecutive samples for error shaping tends to saturate the feedback loop which would render the whole ΔΣ-modulator useless. Using three or more digital values for weighted summing in block 901 requires digital multiplication operations, which tends to add complexity to the circuit. However, the multiplications are fixed at the designing stage, so that CSD coefficients can be utilized instead of real digital multipliers.

With "extension" we mean that increasing from one to three the number of consecutive output values from the second AD converter 507 that are utilized to refine the quantization result given by the first AD converter 504 may be construed as employing a four-tap FIR (Finite Impulse Response) filter instead of a two-tap one.

Figure 10:
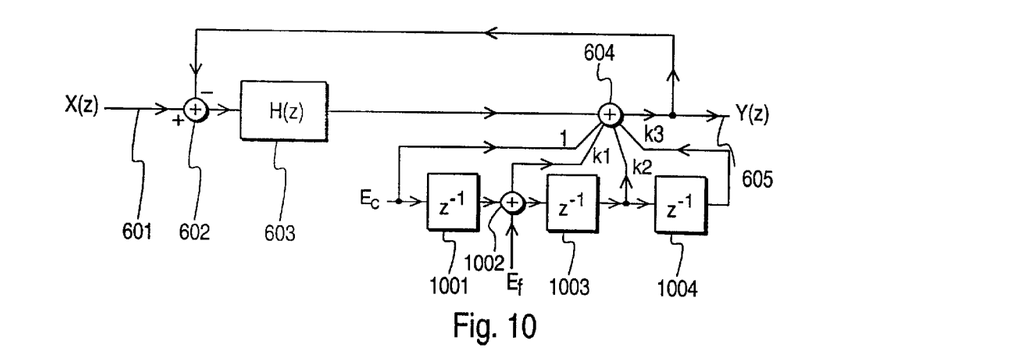
FIG. 10 illustrates a signal flow graph associated with the embodiment of FIG. 9.

FIG. 10 illustrates the signal flow graph for an embodiment the architecture of which is that given in FIG. 9 so that the value for K is three. The main signal line from the input line 601 through the first adder 602, the loop filter 603 and the second adder 604 to the output line 605 with its associated feedback loop from the output line 605 to the first adder 602 are similar to their counterparts in FIG. 6. The quantization noise factors come to the inputs of the second adder 604 through four lines. From the series connection of a first $z^{-1}$ transfer function block 1001, a third adder 1002, a second $z^{-1}$ transfer function block 1003 and a third $z^{-1}$ transfer function block 1004 there are connections to the second adder 604 from the input of the first $z^{-1}$ transfer function block 1001, from one output of the third adder 1002, and from outputs of the second and third $z^{-1}$ transfer function blocks 1003 and 1004 respectively. The weighting coefficients of these connections may be designated by 1, k1, k2 and k3 respectively. The coarse quantization noise source $E_c$ is coupled to the input of the first $z^{-1}$ transfer function block 1001, and the fine quantization noise source $E_f$ is coupled to one input of the third adder 1002.

For generality we may assume that the error shaping function has a FIR-type (Finite Impulse Response) general transfer function N(z). Now the output of the ΔΣ-modulator may be written as a function of the input as $$Y(z) = \frac{H(z)}{1+H(z)}X(z) + \frac{N(z)}{1+H(z)}E_c(z) + \frac{N(z)-1}{1+H(z)}E_f(z)$$

Here the two latter terms in the sum are quantization error terms. If N(z) is designed to be approximately zero at low frequencies then the denominator of the fine error transfer function is close to unity and the situation is the same as in the case of FIG. 6. However, as the main purpose of increasing the taps in the coarse error shaping FIR is to reduce the minimum limit of useful oversampling ratios we must study what happens at higher frequencies. Previously we designated the tap coefficients in a four-tap FIR as 1, k1, k2 and k3; if we select k1=k2=−0.945 and k3=1 the denominator D(z) of the fine error transfer function becomes $$D(z)=z^{-1}(-0.945-0.945z^{-1}+z^{-2})$$

which increases the fine quantization error by less than 0.2 dB for all oversampling ratios greater than 12. At low frequencies the fine quantization error is attenuated by 1 dB. Care must be taken to design the coarse error shaping FIR since it is possible that a badly designed coarse error shaping FIR increases the fine quantization error more than it decreases the coarse quantization error.

Figure 11:
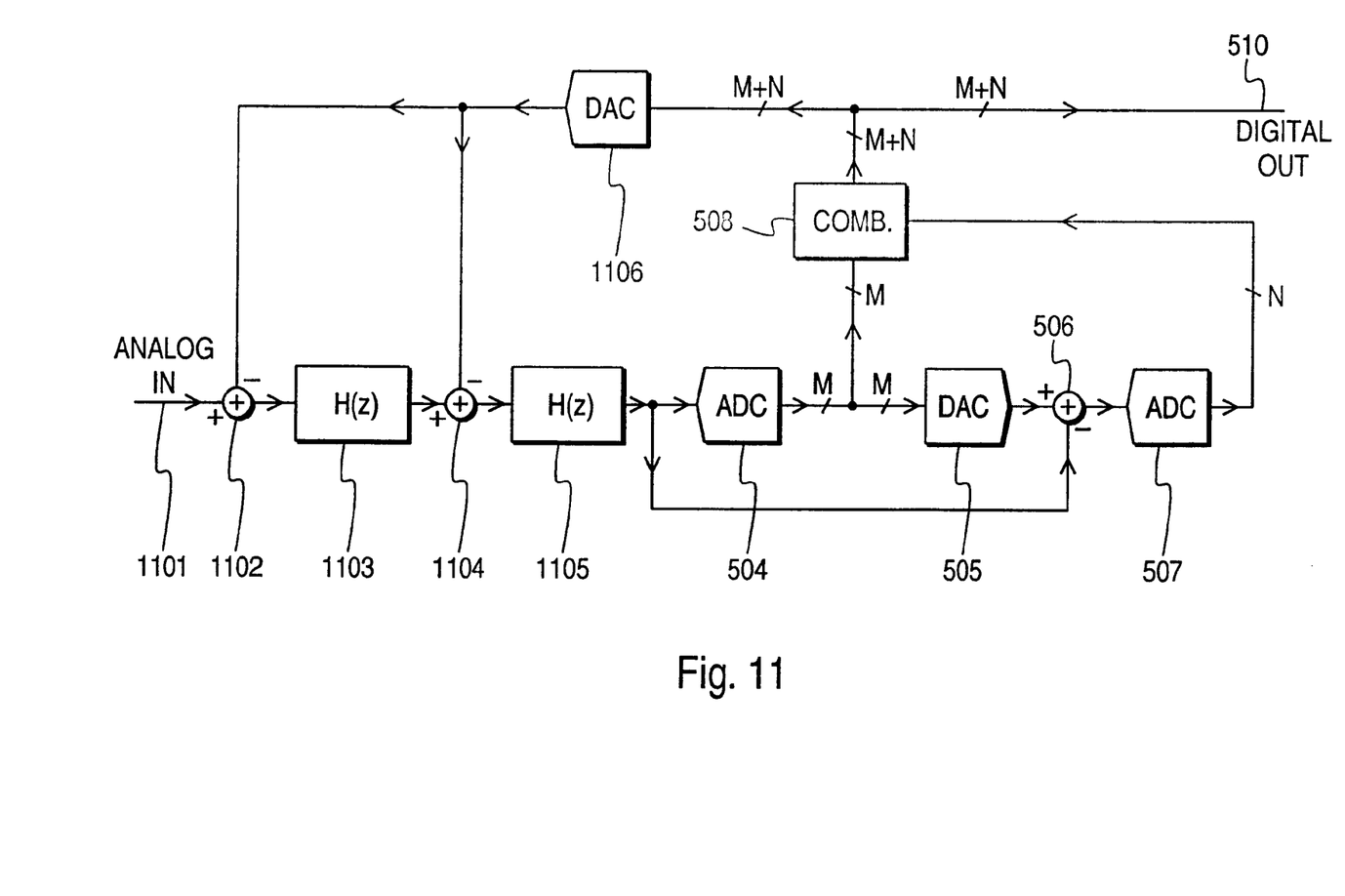
FIG. 11 illustrates another modification to the embodiment of FIG. 5
Figure 12:
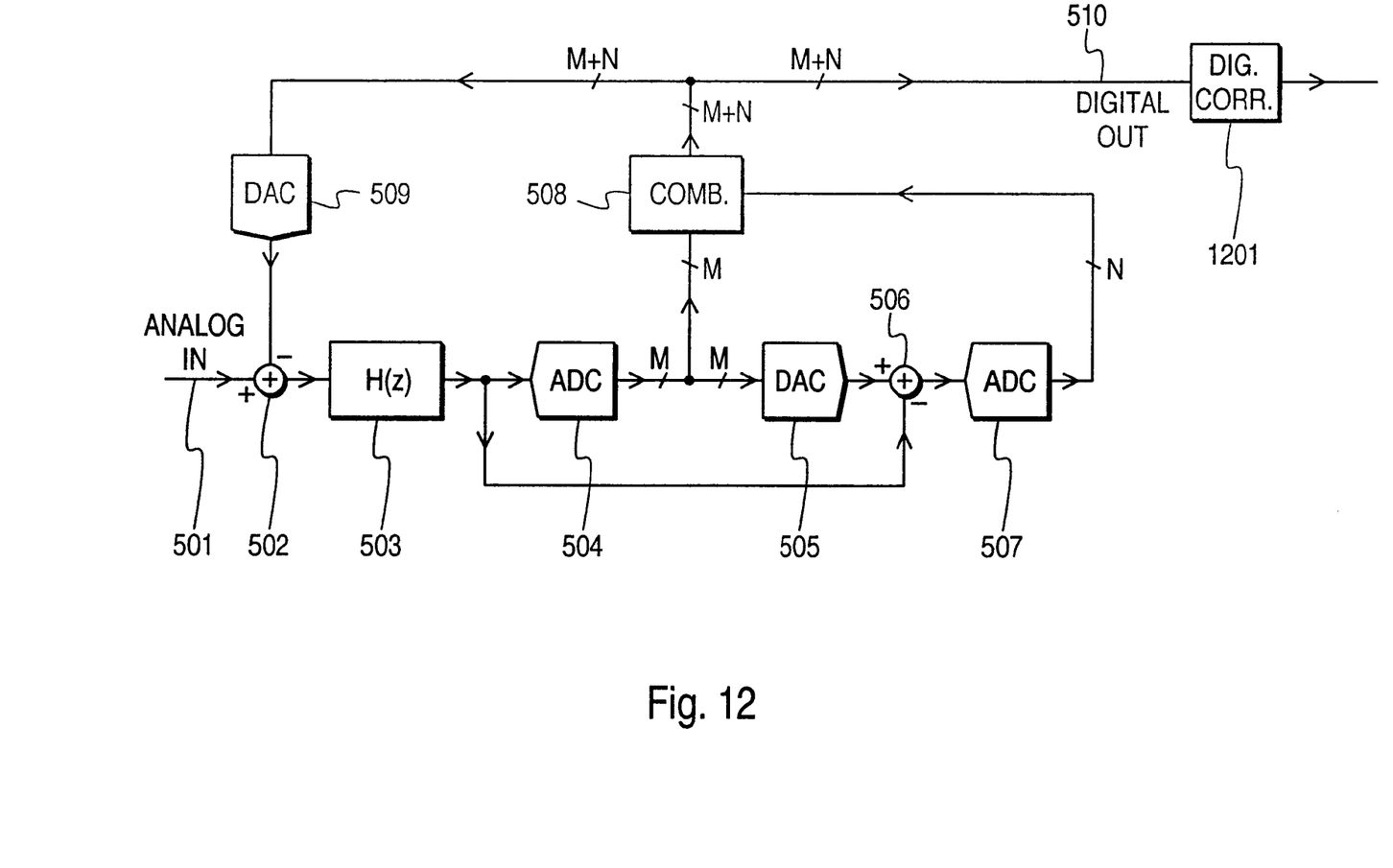
FIG. 12 illustrates another modification to the embodiment of FIG. 5.

The invention does not rule out the application of generally known modifications to ΔΣ-modulators. FIG. 11 illustrates a second-order ΔΣ-modulator with two-stage multibit internal AD conversion, i.e. an application of the generally known second-order modification to the embodiment shown in FIG. 5. The input section of the ΔΣ-modulator consists of an input line 1101, a first adder 1102, a first loop filter 1103, a second adder 1104 and a second loop filter 1105. The negative input terminals of the first and second adders 1102 and 1104 are coupled to the output of a common DA reconverter 1106. The other parts of the circuit are similar to those in FIG. 5. Also higher-order feedback loops could be built. FIG. 12 shows the application of the generally known digital correction principle to the embodiment of FIG. 5; the output line 510 goes through a digital correction block 1201 which may be of any type known as such. Also other additions and modifications to the described multistage ΔΣ-modulator are possible without parting from the scope of the appended patent claims. It is possible to apply more than one of the modifications shown separately in FIGS. 7, 8, 9, 11 and 12: for example it is possible to combine the embodiments of FIGS. 9, 11 and 12 so that in a higher order ΔΣ-modulator error shaping is applied to further lower the limit of minimum oversampling ratio, and digital correction is used to compensate for potential nonlinearity.

What is claimed is:

1. A delta-sigma modulator for converting an analog input signal into a digital output signal, comprising:
    a first analog to digital converter having a first analog input and a first digital output,
    an error quantization unit coupled to the first digital output for determining the quantization error caused by the first analog to digital converter, and
    first signal combining means for combining the outputs of the first analog to digital converter and said error quantization unit to form the digital output signal.

2. A delta-sigma modulator according to claim 1, wherein said error quantization unit comprises:

a digital to analog converter coupled to the first digital output, a second analog to digital converter having a second analog input and a second digital output and second signal combining means coupled between said digital to analog converter and said second analog input for providing a processed input signal to the second analog to digital converter.

3. A delta-sigma modulator according to claim 2, comprising a coupling between said second signal combining means and the first analog input, so that said second signal combining means are arranged to calculate the difference between a signal obtained from the first analog input and a signal obtained from said digital to analog converter.

4. A delta-sigma modulator according to claim 2, comprising a feedback loop coupled between the first digital output and the first analog input for providing a processed input signal to the first analog to digital converter, wherein said first signal combining means are a part of said feedback loop.

5. A delta-sigma modulator according to claim 1, comprising a multitude of error quantization units coupled in series to the first digital output for determining a series of quantization errors caused by the first analog to digital converter and said multitude of error quantization, wherein said first signal combining means is arranged to combine the outputs of the first analog to digital converter and said multitude of error quantization units to form the digital output signal.

6. A delta-sigma modulator according to claim 1, comprising:

a feedback loop coupled between the first digital output and the first analog input for providing a processed input signal to the first analog to digital converter, third signal combining means for combining the outputs of the first analog to digital converter and said error quantization unit to form the feedback signal fed into said feedback loop and delay means coupled between the first digital output and said first signal combining means for delaying a signal obtained from the first analog to digital converter before combining the outputs of the first analog to digital converter and said error quantization unit to form the digital output signal.

7. A delta-sigma modulator according to claim 1, comprising error shaping means coupled between said error quantization unit and said first signal combining means.

8. A delta-sigma modulator according to claim 7, wherein said error shaping means comprises:

a register for storing a number of recent outputs from said error quantization unit and weighted summing means for providing a weighted sum of the contents of said register to said first signal combining means.

9. A delta-sigma modulator according to claim 1, comprising a feedback loop of at least second order coupled between the first digital output and the first analog input for providing a processed input signal to the first analog to digital converter.

10. A delta-sigma modulator according to claim 1, comprising a modulator output and a digital correction unit coupled to said modulator output for digitally correcting the digital output signal.

11. A method for converting an analog input signal into a digital output signal, comprising the steps of:

a) calculating the difference between an analog sample and the equivalent of a previously digitized analog sample, b) filtering the result of step a), c) converting the result of step b) into digital form, d) feeding the result of step c) into a feedback loop to be used as the equivalent of a previously digitized analog sample in the conversion of a subsequent analog sample, e) quantizing the quantization error caused in step c), and f) combining the results of steps c) and e) into a digital output signal.

12. A method according to claim 11, wherein step e) comprises the substeps of:

e1) converting the result of step c) into analog form, e2) calculating the difference between the results of steps b) and e1) and e3) converting the result of step e2) into digital form.

13. A method according to claim 11, comprising the steps of:

performing steps c) and d) during a certain cycle of a clock signal performing step f) during a subsequent cycle of said clock signal; so that at step f) the quantized quantization error to be combined with a result of step c) is associated with a previous digitized sample than said result of step c).

14. A method according to claim 11, wherein step e) comprises the substep of:

e4) storing a number of consecutively obtained quantized quantization errors and providing a weighted sum of them as the result of step e).

15. A method according to claim 11, comprising between steps b) and c) the steps of:

a') calculating the difference between the result of step b) and the equivalent of a previously digitized sample and b') filtering the result of step a').

\* \* \* \* \*